(12) United States Patent
Hyde et al.

(10) Patent No.: US 10,394,103 B2
(45) Date of Patent: Aug. 27, 2019

(54) IMAGING APPARATUS AND METHOD HAVING AN IMAGE PROCESSING MODULE RECONSTRUCTING A THREE DIMENSIONAL IMAGE FROM TWO DIMENSIONAL IMAGE DATA USING A GHOST IMAGING ALGORITHM

(71) Applicant: BAE Systems plc, London (GB)

(72) Inventors: Lydia Ann Hyde, Chelmsford (GB); Andrew James Williams, Chelmsford (GB); Michael Stewart Griffith, Chelmsford (GB); Nicholas Giacomo Robert Colosimo, Preston (GB)

(73) Assignee: BAE Systems plc, London (GB)

( * ) Notice: Subject to any disclaimer, the term of this patent is extended or adjusted under 35 U.S.C. 154(b) by 8 days.

(21) Appl. No.: 15/754,094

(22) PCT Filed: Aug. 23, 2016

(86) PCT No.: PCT/GB2016/052620
§ 371 (c)(1),
(2) Date: Feb. 21, 2018

(87) PCT Pub. No.: WO2017/033003
PCT Pub. Date: Mar. 2, 2017

(65) Prior Publication Data
US 2018/0252986 A1    Sep. 6, 2018

(30) Foreign Application Priority Data

Aug. 25, 2015  (EP) ..................................... 15275187
Aug. 25, 2015  (GB) ................................... 1515103.8

(51) Int. Cl.
*H04N 5/232*   (2006.01)
*G02F 1/39*    (2006.01)
(Continued)

(52) U.S. Cl.
CPC ................ *G02F 1/39* (2013.01); *G01S 17/66* (2013.01); *G01S 17/89* (2013.01); *H01L 25/042* (2013.01); *H04N 5/30* (2013.01)

(58) Field of Classification Search
CPC .... H04N 13/361; H04N 5/23229; H04N 5/30; H04N 13/302; H01L 25/042
(Continued)

(56) References Cited

U.S. PATENT DOCUMENTS 8,717,416 B2 * 5/2014 Russell ................ H04N 13/254
348/46
2006/0268360 A1   11/2006 Jones
(Continued)

FOREIGN PATENT DOCUMENTS

CN        104063623 A    9/2014
WO          0159890 A1    8/2001

OTHER PUBLICATIONS

International Preliminary Report on Patentability of International Application No. PCT/GB2016/052620, dated Mar. 8, 2018, 11 pages.
(Continued)

*Primary Examiner* — Que Tan Le
(74) *Attorney, Agent, or Firm* — Maine Cernota & Rardin

(57) ABSTRACT

Imaging apparatus on a host platform having an external surface, the external surface comprising a first surface facing a first direction and a second surface facing a second direction, the second direction being different to the first, the apparatus comprising a first and second plurality of single pixel detectors (10) distributed about said external surface such that the first plurality of single pixel detectors are distributed over the first surface and the second plurality of single pixel detectors are distributed over the second surface, each single pixel detector being configured to receive radiation reflected by an object or region of interest (18) and generate two-dimensional image data representative thereof, the apparatus further comprising an image processing module (16) for receiving said two-dimensional image data from each of a plurality of single pixel detectors (10) and recon- (Continued)

structing a three-dimensional image of said object or region of interest (18) using a ghost imaging algorithm.

18 Claims, 2 Drawing Sheets

(51) Int. Cl.
*G01S 17/89* (2006.01)
*H01L 25/04* (2014.01)
*H04N 5/30* (2006.01)
*G01S 17/66* (2006.01)

(58) Field of Classification Search
USPC .................................. 250/208.1, 239, 214 R
See application file for complete search history.

(56) References Cited

U.S. PATENT DOCUMENTS

| | | |
|---|---|---|
| 2010/0038519 A1 | 2/2010 | Lin |
| 2010/0258708 A1 | 10/2010 | Meyers et al. |
| 2010/0294916 A1 | 11/2010 | Meyers et al. |

OTHER PUBLICATIONS

International Search Report and Written Opinion of International Application No. PCT/GB2016/052620, dated Nov. 28, 2016, 17 pages.
Barry L. Stann: "MEMS-scanned ladar sensor for small ground robots", Midical Imaging 2002: PACS and Integrated Medical Information Systems: Design and Evaluation, vol. 7684, Apr. 22, 2010, p. 76841E, XP055250611.
William Ruff eta l: "Performance of an FM/cw prototype ladar using a 32-element linear self-mixing detector array", Medical Imaging 2002: PACS and Integrated Medical Information Systems: Design and Evaluation, vol. 5086, Aug. 22, 2003, pp. 58-69, XP055250646.
Matthew P Edgar et al: "3D computational ghost imaging", Medical Imaging 2002: PACS and Integrated Medical Information Systems: Design and Evaluation, vol. 8899, Oct. 16, 2013, p. 889902, XP055251458.
Extended European Search Report of European Application No. EP15275187.1, dated Feb. 23, 2016, 11 pages.
Search Report under Section 17(5) of Great Britain Application No. GB1515103.8, dated Jan. 25, 2016, 4 pages.
Science, vol. 340, May 17, 2013, B. Sun et al. "3D Computational Imaging with Single-Pixel Detectors."

\* cited by examiner

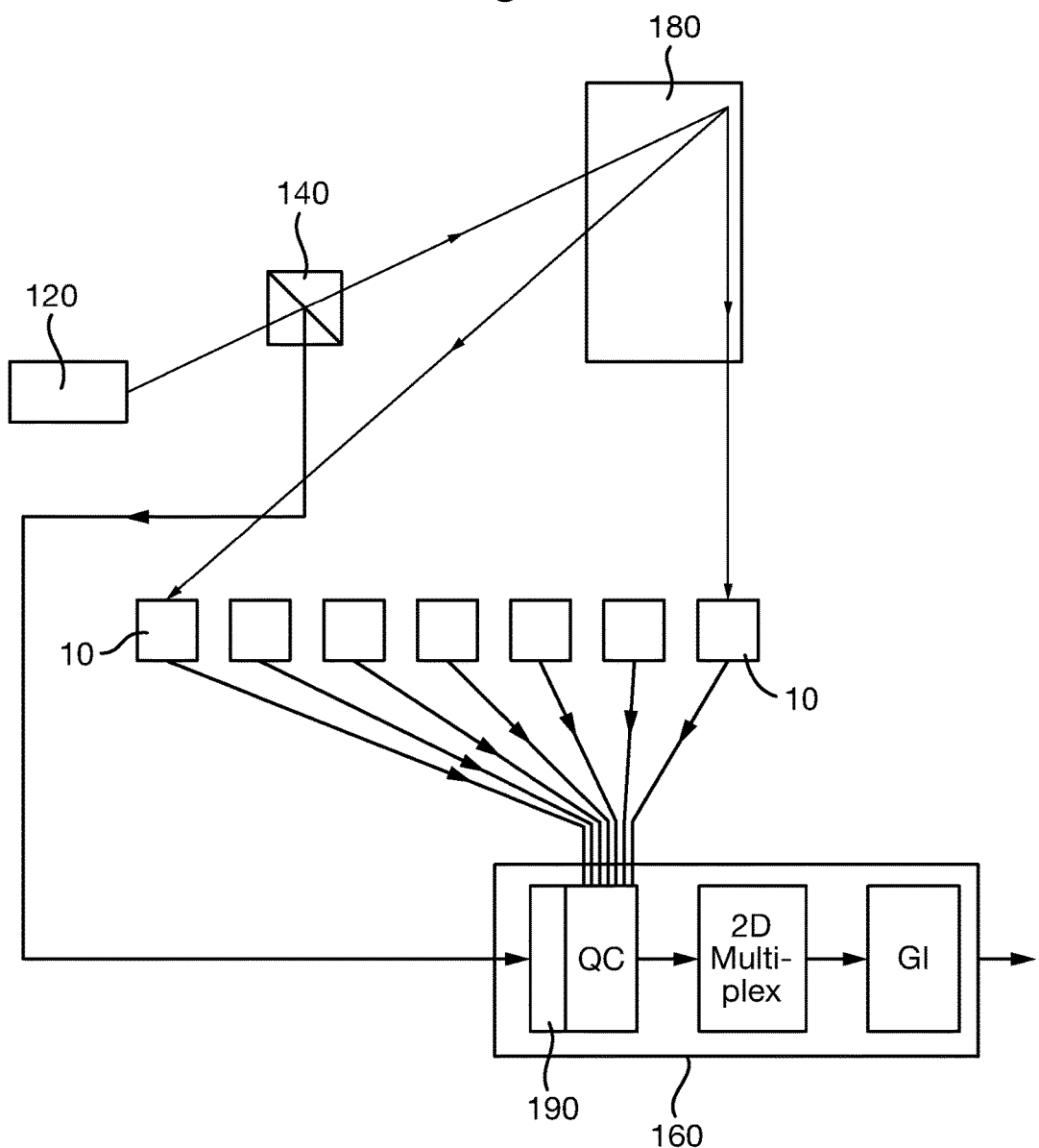

IMAGING APPARATUS AND METHOD HAVING AN IMAGE PROCESSING MODULE RECONSTRUCTING A THREE DIMENSIONAL IMAGE FROM TWO DIMENSIONAL IMAGE DATA USING A GHOST IMAGING ALGORITHM

RELATED APPLICATIONS

This application is a national phase application filed under 35 USC § 371 of PCT Application No. PCT/GB2016/052620 with an International filing date of Aug. 23, 2016 which claims priority of GB Patent Application 1515103.8 filed Aug. 25, 2015 and EP Patent Application 15275187.1 filed Aug. 25, 2015. Each of these applications is herein incorporated by reference in its entirety for all purposes.

FIELD OF THE INVENTION

This invention relates generally to an imaging apparatus and method and, more particularly, to a distributed ghost imaging apparatus and method for enabling long-range and/or wide angled imaging of targets.

BACKGROUND OF THE INVENTION

Modern tactical aircraft use a number of imaging aids to view external objects/scenes; and visible, infrared and/or narrow-spectrum optical devices are used in various applications to form an image of a scene. Real-time acquisition of high-resolution, wide field of regard and high dynamic range images is essential for many military and civilian surveillance applications. In order to achieve a wide field of regard, an imaging device may be mounted on a gimbal, with a steering subsystem being provided to enable the imaging device to be steered to cover a required field of view. In order to achieve long range imaging, relatively large optical systems (i.e. long focal length and large sensing aperture) are required; and in all cases, the imaging components, which tend to be bulky and complex, are affixed to the host platform, which makes a significant contribution to the overall size, weight and power associated with the host platform subsystems.

SUMMARY OF THE INVENTION

It is an object of aspects of the present invention to address at least some of these issues, and provide an imaging apparatus that can be readily configured to have a wide field of regard and/or long range imaging capability, without significant detriment to the size, weight and power contribution of the imaging system to the overall host platform, whilst retaining an adequate resolution, such that real-time acquisition of high resolution, wide field of regard and/or high dynamic range images can be achieved in environments such as airborne platforms, where size, weight and power considerations may be critical.

In accordance with an aspect of the present invention, there is provided imaging apparatus on a host platform having an external surface the external surface comprising a first surface facing a first direction and a second surface facing a second direction, the second direction being different to the first, the apparatus comprising a first and second plurality of single pixel detectors distributed about said external surface such that the first plurality of single pixel detectors are distributed over the first surface and the second plurality of single pixel detectors are distributed over the second surface, each single pixel detector being configured to receive radiation reflected by an object or region of interest and generate two-dimensional image data representative thereof, the apparatus further comprising an image processing module for receiving said two-dimensional image data from each of a plurality of single pixel detectors and reconstructing a three-dimensional image of said object or region of interest using a ghost imaging algorithm.

In an exemplary embodiment of the present invention, the apparatus may further comprise a radiation source module including a radiation source. The radiation source module may include a control device configured to adjustably direct an output of said radiation source onto an object or region of interest. In an exemplary embodiment, the radiation source module may comprise a target acquisition device for detecting an object or region of interest and generating a signal configured to cause said control device to direct said radiation source output to irradiate said detected object or region of interest.

The apparatus may be configured to determine which of the first or second surfaces are facing the region of interest, and activate the first plurality of single pixel detectors if the first surface is facing the region of interest or activate the second plurality of single pixel detectors if the second surface is facing the region of interest.

The radiation source module may also comprise a tracking device for tracking relative movement between the host platform and an object or region of interest and generating a signal configured to cause said control device to adjust the direction of said radiation source output such that irradiation thereby of said object or region of interest is maintained.

In a first exemplary embodiment, the radiation source may comprise a structured light source comprising a laser and a spatial light modulator through which light from said laser passes before irradiating said object or region of interest. In this case, the ghost imaging algorithm may be a computational ghost imaging algorithm. The spatial light modulator may be configured to provide a time varying mask through which light from said laser passes to irradiate said object or region of interest, said apparatus further comprising a storage module for receiving data representative of a mask configuration and associated time. The mask may be of spatially random configuration. In an exemplary implementation, the spatial light modulator may comprise a digital micromirror device including a programmable on/off duty cycle for effecting said time varying mask. The radiation source may be provided on the host platform, at any suitable location. However, in some exemplary embodiments, the radiation source may be provided at a location geographically separated from said host platform. For example, the radiation source may be provided on another platform, thereby decreasing the size, weight and power overhead in relation to the host platform itself.

In a second exemplary embodiment, the radiation source may comprise a photon source for generating a photon beam and an optical device located within said photon beam configured to split photons from said beam into two or more entangled photons, and may be configured to direct at least one of said entangled photons toward said object or region of interest and another of said entangled photons to a detector, wherein the apparatus may comprise a quantum correlation circuit configured to generate said two-dimensional image data, and said ghost imaging algorithm may comprise a quantum ghost imaging algorithm. In this case, the optical device may comprise a nonlinear crystal.

At least some of said single pixel detectors may include a wireless data transceiver configured to enable wireless data communication therebetween. For example, the wireless data transceiver may comprise a short wavelength radio frequency transceiver. The above-mentioned wireless data communication may comprise communication between said single pixel detectors of one or more relevancy parameters indicative of one or more similarities between respective states of said detectors. A state may comprise, for example, pointing angle and/or field of regard of a respective single pixel detector. If a relevancy parameter is determined to be met between two or more single pixel detectors, the apparatus may be configured to cause the respective two-dimensional image data output thereby to be integrated.

As stated above, the single pixel detectors are distributed about the external surface or skin of the host platform. They may be parasitically mounted thereon but, in an alternative exemplary embodiment, they may be integrally mounted within said external surface.

The single pixel detectors may each include a local energy source for supplying electrical energy thereto.

In accordance with another aspect of the present invention, there is provided an imaging method for a host platform having an external surface, the method comprising providing a plurality of single pixel detectors distributed about said external surface, each single pixel detector being configured to receive radiation reflected by an object or region of interest and generate two-dimensional image data representative thereof, the method further comprising configuring an image processing module to receive said two-dimensional image data from each of a plurality of single pixel detectors and reconstruct a three-dimensional image of said object or region of interest using a ghost imaging algorithm.

In accordance with yet another aspect of the present invention, there is provided a radiation source module for apparatus as described above, comprising a radiation source, a control device configured to adjustably direct an output of said radiation source, and a target acquisition device for detecting an object or region of interest and generating a control signal configured to cause said control device to direct said output of said radiation source onto said object or region of interest. In this case, the radiation source module may further include a tracking device for tracking relative movement between the host platform and the object or region of interest and generating a signal configured cause the control device to adjust the direction of the radiation source output so as to maintain irradiation thereby of the object or region of interest.

BRIEF DESCRIPTION OF THE DRAWINGS

These and other aspects of the present invention will become apparent from the following specific description in which embodiments of the present invention will now be described by way of examples only and with reference to the accompanying drawings, in which:

FIG. 2 is a schematic block diagram of imaging apparatus according to a second exemplary embodiment of the present invention.

DETAILED DESCRIPTION

Figure 1:
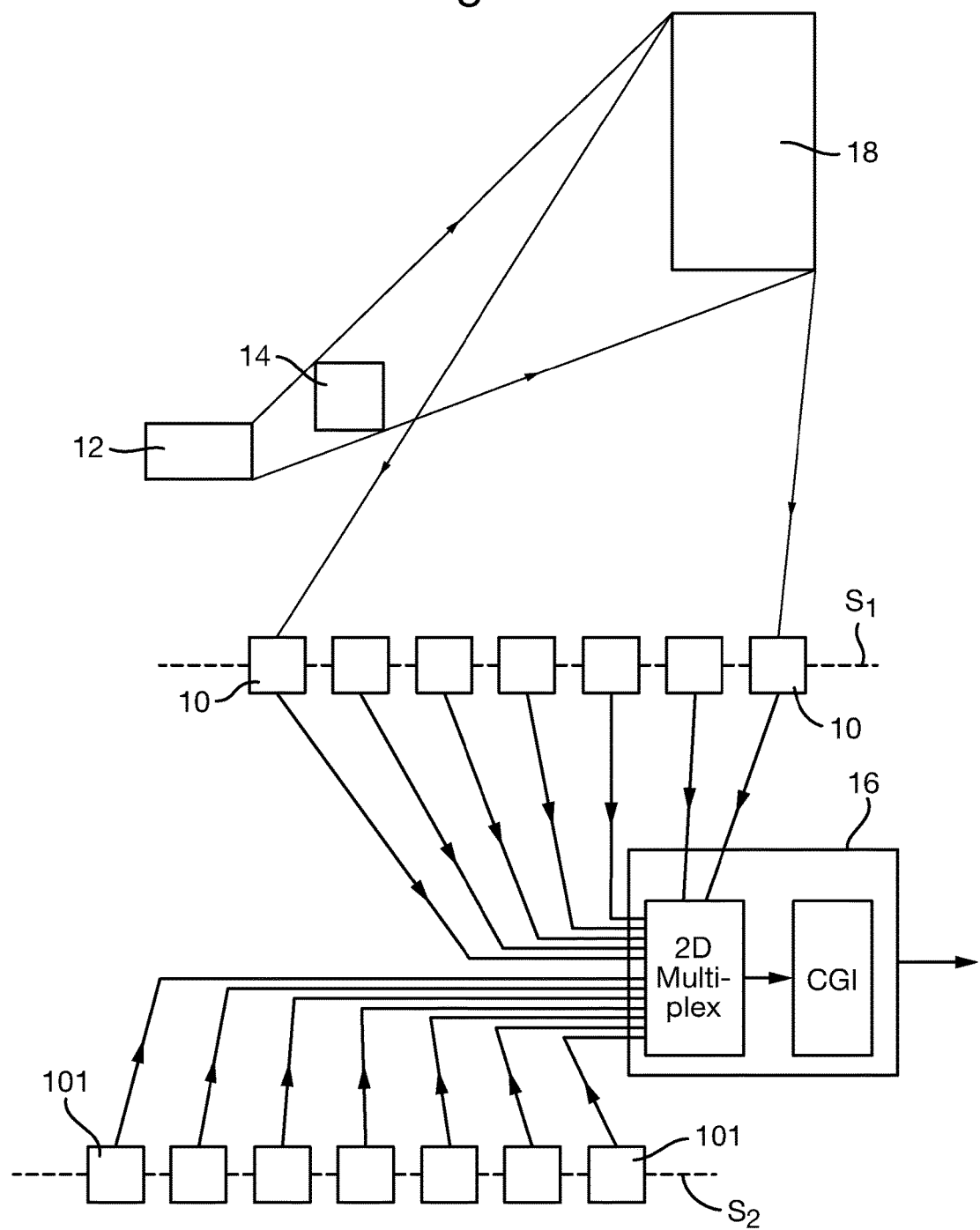
FIG. 1 is a schematic block diagram of imaging apparatus according to a first exemplary embodiment of the present invention.

In general, Computational Ghost Imaging (CGI) involves the use of a structured light source to illuminate an object or region of interest and a single pixel detector to receive the reflections. The detector produces a two dimensional image of the object or region of interest, where the resulting image is a function of the level and type of illumination structure used by the illuminating system (i.e. the structured light source).

Referring to FIG. 1 of the drawings, a system according to an exemplary embodiment of the present invention comprises a first plurality of single pixel detectors 10, a second plurality of single pixel detectors 101, a structured light source comprising a continuous wave (CW) or pulsed power laser (PPL) 12 and a spatial light modulator (SLM) 14, and an image processing module 16.

The system is mounted on a platform such that the first plurality of single pixel detectors 10 are distributed over a first surface S1 of the host platform, and the second plurality of single pixel detectors 101 are distributed over a second surface S2 of the host platform. The first and the second surface point in different directions, and as shown in the particular embodiment, are configured to point in opposite directions. In alternative embodiments all external surfaces of the platform may have detectors distributed over.

Each single pixel detector 10, 101 comprises a single photon detector configured to record a measurement as an output voltage, representative of the quantity of light detected by the photon detector. The detector further includes an A/D converter or microprocessor for converting the above-mentioned measurement into a suitable digital representation thereof, and a local energy source. The energy source may, for example, comprise an electrical cell, such as a Lithium-ion cell or the like, but may alternatively comprise a device that harvests energy from the local environment through, for example, solar irradiation (e.g. using a solar photo-voltaic device), vibration (e.g. using a piezo device), or thermal differences (e.g. using a thermionic device). However, other suitable energy sources for a single pixel detector will be known to a person skilled in the art and the present invention is in no way intended to be limited in this regard.

In a system according to an exemplary embodiment of the present invention, a group of plurality of such single pixel detectors are utilised, which are applied parasitically to the skin or external surface of a platform, or integrated therein so as to form a fundamental part of its structure. Each single pixel detector may hereinafter be referred to as a 'node', with each node including a short wavelength radio frequency transceiver (e.g. 60 GHz) for wirelessly communicating its digital output to other nodes. The respective outputs of the single pixel detectors are also communicably coupled to the image processing module 16.

As stated above, the structured light source in this exemplary embodiment of the present invention comprises a continuous wave (CW) or pulsed power laser (PPL) 12 and a spatial light modulator (SLM) 14. The SLM is configured to provide a time varying (spatially random) 'mask' through which the laser light passes and thus gains spatial information, which it ultimately conveys to the object or region of interest 18 and then, by reflection, to one or more single photon detectors within a particular group. Thus, the SLM 14 may, for example, comprise a digital micromirror device (DMD) having multiple (thousands or even millions of) individually controlled micromirrors built on top of an associated CMOS memory cell. Each micromirror can be oriented in one of two directions: the 'on' position or state allows light to pass through, and the 'off' position or state reflects light incident thereon, thereby effectively blocking its passage through the device. A controller loads each underlying memory cell with a '1' (on) or a '0' (off), and a mirror reset pulse, when subsequently applied, causes each micromirror to be electrostatically deflected about a hinge to the deflection angle corresponding to the state specified by the value held in the associated memory cell. The on/off duty cycle of each micromirror is fully programmable, such that the DMD can be readily used to provide the above-mentioned time-varying 'mask'. However, other methods of providing a time-varying (spatially random) 'mask' through which then laser light passes to gain the required spatial information will be known to a person skilled in the art, and the present invention is not necessarily intended to be limited in this regard. Furthermore, it will be appreciated that the structured light source may be provided on the same platform as the single pixel detectors (the 'host' platform) but may, alternatively, be located on another platform that is geographically separated from the host platform, thereby further decreasing the space, weight and power considerations in relation to the host platform.

The structured light source may be configured to illuminate either a region associated with the first plurality of single pixel detectors, or a region associated with the second plurality of single pixel detectors.

In use, laser light passes through the SLM 14, thus gaining spatial information which is conveyed to the object or region of interest 18. Light is then reflected therefrom, back to the single pixel detectors 10. Each single pixel detector system can only output a single value corresponding to a time interval, which value is communicated to the image processing module 16. However, if the illumination 'mask' being used at a given time is known, then it is possible to create a multiplexed, two-dimensional image from a larger number of these pixel values by correlating the known spatial information from the captured signals. A number of processes for achieving this will be known to a person skilled in the art, such as those that employ Hadamard 2D matrices for example, and the present invention is not in any way intended to be limited in this regard. Thus, irrespective of the process used, the image processing module 16 receives the measurements from the single pixel detectors and creates a multiplexed two-dimensional image of the object or region of interest 18. Finally, the multiplexed image can be fully reconstructed using any known computational ghost imaging algorithm, such as an inverse Hadamard transform for example, but, once again, the present invention is not intended to be in any way limited in this regard. The image processing module 16 can switch between reading the first plurality of single pixel detectors or the second.

As stated above, each single pixel detector includes a short wavelength radio frequency transceiver for enabling it to communicate its digital output to other nodes. Thus, it is envisaged that at least some exemplary embodiments of the present invention may include the facility whereby digital outputs from a plurality of single pixel detectors (captured during the same time interval and, therefore, using the same 'mask') can be correlated according to a predetermined one or more parameters (or 'relevancy') and, subsequently, integrated before use thereof in the image reconstruction process.

All of the nodes will have a fixed, known pointing angle and field of regard relative to each other and the host platform. The absolute pointing angle and field of regard can additionally be determined by the host platform's inertial measurement unit. Thus, for example with regard to the first and second pluralities of detectors, there are circumstances whereby a plurality (or "cluster") of nodes can be determined or known to have a similar pointing angle and field of regard with respect to the object or region of interest. In this case, the digital signals output by each of these nodes may be integrated, and the integrated signal then used in the subsequent image reconstructions process. Such integration may be effected substantially simultaneously (either in the image processing module or in a processing module of one or more selected/predetermined nodes) and prior to the image reconstruction process, and thus contributes to an element of decentralisation of the overall image processing function. Thus, similar image signals can be combined to enhance the resolution of the resultant image and/or boost the image signal above any noise, without significant additional processing overhead. It will be appreciated by a person skilled in the art that correlation on the basis of 'relevancy' is not necessarily limited to pointing angle and field of regard, and it is envisaged that other correlation parameters may be used/incorporated.

Overall, therefore, due to the utilisation of multiple, spatially distributed single pixel detectors about a platform skin, a wide range of viewing angles can be achieved and, therefore, a wide field of regard system achieved, subject only to the availability of the structured illumination source to illuminate an object or region of interest. Furthermore, the above-described coherent integration of detector pixel responses allows for improvements in system sensitivity and, therefore, an increase in the imaging or detection range of the system. Still further, both of these objects are achieved by the use of single pixel, largely independent detectors, which are considered to be highly advantageous in many applications, as they can be readily affixed to, or incorporated into, any platform without significant space, weight or power issues arising.

Quantum ghost imaging utilises a concept known as quantum entanglement which means that multiple particles are linked together in a way such that the measurement of one particle's quantum state determines the possible states of the other particles. Measurements of physical properties such as position, momentum, spin, polarization, etc. performed on entangled particles are found to be appropriately correlated. In quantum ghost imaging, a succession of entangled photon pairs is created and, for each pair, one of the photons is sent towards the object or region of interest and the other is held back (and contained, for example, in a fibre-optic loop). When a reflected photon is received from the object/region of interest, a correlation check is performed with the photon(s) previously held back. If the correlation is positive, then the contribution made by the reflected photon(s) to the ultimate formation of the image is accepted. A negative correlation would result in the photon(s) contribution being discounted, as they are not the photons used to illuminate the object/region and, therefore, potentially represent noise that would otherwise pollute or corrupt the image of the object/region.

Referring now to FIG. 2 of the drawings, a system according to another exemplary embodiment of the present invention comprises a plurality of single pixel detectors 100 and an image processing module 160. The system further comprises a light source comprising a photon source, such as a laser 120 and an optical device such as a nonlinear crystal 140 for causing a source photon to be split into two, entangled photons. Nonlinear optic (NLO) crystals for generating entangled photons are known, and examples include beta Barium Borate (BBO), Silver Gallium Sulfide (AgGaS$_2$) and Silver Gallium Selenide (AgGaSe$_2$). However, other examples of nonlinear crystals will be known to a person skilled in the art, and the present invention is not in any way intended to be limited in this regard. It will be further appreciated by a person skilled in the art that the source photon can be split into more than two entangled photons, as required. In this case, a photon source and optical device arrangement will be provided in respect of each single pixel camera, and co-located therewith, so as to retain the required spatial information (on the basis that the source location in relation to the object or region of interest is thus known).

In use, each photon source 120 fires photon pulses into the non linear crystal 140, which causes each source photon to be split into two (or more) entangled photons. At least one of the entangled photons is directed (by the crystal or other optical elements, not shown) into a fibre optic loop or other storage device 190 in the image processing module 160 and the remaining entangled photon(s) is/are directed toward the object or region of interest 180. The photons reaching the object or region of interest 180 are reflected back to the single pixel detectors 10 which create respective digital signals representative of the photons incident thereon, retaining the respective physical properties of the received photon(s). The image processing module 160 receives the digital outputs from the single pixel cameras and includes a quantum correlation circuit (QC) including a quantum detector configured to compare each photon received from the single pixel camera against photons contained within the fibre-optic loop to determine if it is a photon which originated from the source. If it is determined not to have originated from the source, the photon is discarded as noise. If the photon is determined to have originated from the source, it is used to generate respective two-dimensional image data. The image processing module 160 then creates a multiplexed two-dimensional image of the object or region of interest 180, as before. Finally, the multiplexed image can be fully reconstructed using any known ghost imaging algorithm.

In an alternative exemplary embodiment, each single pixel detector module could include its own quantum correlation circuit that has access to the fibre-optic loop or other storage device 190. Thus, in this case, upon receipt of a photon, the respective QC circuit would transmit a request to the storage device 190 for data representative of the original entangled photons and use the returned data to perform the require quantum correlation in respect of the received photon. In this case, the data returned to the QC circuit in response to a request therefrom might be in a converted form, wherein the central processing module includes means for converting the stored photons from an entangled state into another state (e.g. radio frequency) for transmission to the individual QC circuit(s).

In both exemplary embodiments, and others, the light source may be part of a radiation source module including some means for ensuring that the radiation is directed and maintained on the object or region of interest. In an exemplary embodiment, the module may, for example, include a target acquisition device for scanning the environment within the field of regard of the imaging apparatus and identifying an object to be imaged. Alternatively, of course, the object or region of interest can be manually defined and light source electronically driven and guided accordingly, but in either case, the module may further comprise a motion tracking device for tracking relative movement between the host platform and the object or region of interest and generating a signal configured to operate a guide mechanism for guiding the light source such that the radiation emitted thereby consistently and accurately irradiates the object or region of interest.

It will be apparent to a person skilled in the art, from the foregoing description, that modifications and variations can be made to the described embodiments without departing from the scope of the invention as defined in the appended claims.

What is claimed is:

1. An imaging apparatus mounted on a host platform having an external surface, the external surface comprising a first surface facing a first direction and a second surface facing a second direction, the second direction being different from the first direction, the imaging apparatus comprising:
   a first and second plurality of single pixel detectors distributed about said external surface such that the first plurality of single pixel detectors are distributed over the first surface and the second plurality of single pixel detectors are distributed over the second surface,
   each of the single pixel detectors being configured to receive radiation reflected by an object or region of interest and to generate two-dimensional image data representative thereof; and
   an image processing module configured to receive said two-dimensional image data from each of a plurality of said single pixel detectors selected from among said first and second pluralities of single pixel detectors, and to reconstruct therefrom a three-dimensional image of said object or region of interest using a ghost imaging algorithm.

2. The apparatus of claim 1, further comprising a radiation source module comprising a radiation source.

3. The apparatus of claim 2, wherein the radiation source module includes a control device configured to adjustably direct an output of said radiation source onto the object or region of interest.

4. The apparatus of claim 3, wherein the radiation source module further comprises a target acquisition device configured to detect an object or region of interest and to direct a targeting signal to the control device, said control device upon receipt of said targeting signal being configured to direct said radiation source output so as to irradiate said detected object or region of interest.

5. The apparatus of claim 1, wherein the apparatus is configured to determine which of the first or second surfaces is facing the object or region of interest, and to activate the first plurality of single pixel detectors if the first surface is facing the object or region of interest or to activate the second plurality of single pixel detectors if the second surface is facing the object or region of interest.

6. The apparatus of claim 3, wherein the radiation source module further comprises a tracking device that is configured to track relative movement between the host platform and the object or region of interest and to direct a tracking signal to the control device, the control device being configured upon receipt of said tracking signal to adjustably direct said radiation source output such that irradiation thereby of said object or region of interest is maintained.

7. The apparatus of claim 2, wherein the radiation source comprises a structured light source, said structured light source comprising a laser and a spatial light modulator through which light from said laser passes before irradiating said object or region of interest.

8. The apparatus of claim 7, wherein the spatial light modulator is configured to provide a time varying mask through which the light from said laser passes to irradiate said object or region of interest, said apparatus further comprising a storage module for receiving data representative of a mask configuration and associated time of the time varying mask.

9. The apparatus of claim 2, wherein the radiation source comprises:
a photon source that is configured to generate a photon beam; and
an optical device configured to split photons from said beam into two or more entangled photons.

10. The apparatus of claim 9, wherein the optical device comprises a nonlinear crystal.

11. The apparatus of claim 1, wherein at least some of said single pixel detectors are wireless-enabled single pixel detectors that include corresponding wireless data transceivers configured to enable wireless data communication between said wireless-enabled single pixel detectors.

12. The apparatus of claim 1, wherein said single pixel detectors are either parasitically mounted on said external surface of said host platform, or integrally mounted within said external surface of said host platform.

13. The apparatus of claim 1, wherein each of the single pixel detectors includes a local energy source that is configured to supply electrical energy thereto.

14. An imaging method for a host platform having an external surface, the method comprising:
providing a plurality of single pixel detectors distributed about said external surface, each of the single pixel detectors being configured to receive radiation reflected by an object or region of interest and to generate two-dimensional image data representative thereof; and
configuring an image processing module to receive said two-dimensional image data from each of a plurality of said single pixel detectors and to reconstruct a three-dimensional image of said object or region of interest using a ghost imaging algorithm.

15. A radiation source module configured for implementation in cooperation with an imaging apparatus according to claim 2, the radiation source module comprising:
a radiation source;
a control device configured to adjustably direct an output of said radiation source; and
a target acquisition device configured to detect an object or region of interest and to generate a control signal,
the control device being configured upon receipt of said control signal to direct said output of said radiation source onto said object or region of interest.

16. A radiation source module according to claim 15, further comprising:
a tracking device that is configured to track relative movement between the host platform and the object or region of interest, and to generate a tracking signal,
the control device being configured upon receipt of the tracking signal to direct said output of said radiation source so as to maintain irradiation thereby of the object or region of interest.

17. The apparatus of claim 9, wherein the optical device is configured to direct at least one of said entangled photons toward said object or region of interest and another of said entangled photons to a detector.

18. The apparatus of claim 9, wherein:
the apparatus further comprises a quantum correlation circuit that is configured to generate said two-dimensional image data; and
said ghost imaging algorithm comprises a quantum ghost imaging algorithm.

* * * * *